(12) United States Patent
Kura

(10) Patent No.: US 8,186,812 B2
(45) Date of Patent: May 29, 2012

(54) PIEZOELECTRIC ACTUATOR, LIQUID TRANSPORTING APPARATUS, AND METHOD FOR MANUFACTURING PIEZOELECTRIC ACTUATOR

(75) Inventor: Keiji Kura, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 320 days.

(21) Appl. No.: 12/413,461

(22) Filed: Mar. 27, 2009

(65) Prior Publication Data
US 2009/0244205 A1    Oct. 1, 2009

(30) Foreign Application Priority Data
Mar. 31, 2008  (JP) ................... 2008-090372

(51) Int. Cl.
    B41J 2/045   (2006.01)
(52) U.S. Cl. ............. 347/72; 347/20; 347/48; 347/54; 347/68; 347/69; 347/70; 347/71
(58) Field of Classification Search ........... 347/68, 347/70, 71, 72
    See application file for complete search history.

(56) References Cited

U.S. PATENT DOCUMENTS

| | | | |
|---|---|---|---|
| 6,863,383 B2 * | 3/2005 | Takahashi | 347/72 |
| 2002/0140783 A1 * | 10/2002 | Takahashi | 347/72 |
| 2002/0140785 A1 * | 10/2002 | Takahashi | 347/72 |
| 2002/0140787 A1 * | 10/2002 | Takahashi | 347/72 |
| 2003/0146956 A1 * | 8/2003 | Takahashi | 347/71 |
| 2004/0135852 A1 * | 7/2004 | Suzuki | 347/72 |
| 2007/0076054 A1 | 4/2007 | Sugahara et al. | |
| 2009/0096844 A1 | 4/2009 | Kojima et al. | |

FOREIGN PATENT DOCUMENTS

| | | | |
|---|---|---|---|
| JP | H05-048171 A | | 2/1993 |
| JP | H09-029963 A | | 2/1997 |
| JP | 2000-133852 A | | 5/2000 |
| JP | 2001-044524 | * | 2/2001 |
| JP | 2001-044524 A | | 2/2001 |
| JP | 2004-241669 A | | 8/2004 |
| JP | 2005-212280 A | | 8/2005 |
| JP | 2007-118585 A | | 5/2007 |
| JP | 2007-256922 A | | 9/2007 |

OTHER PUBLICATIONS

Japan Patent Office; Notice of Reasons for Rejection in Japanese Patent Application No. 2008-090372 mailed May 6, 2010.

* cited by examiner

*Primary Examiner* — Ryan Lepisto
(74) *Attorney, Agent, or Firm* — Baker Botts L.L.P.

(57) ABSTRACT

A piezoelectric actuator includes a first piezoelectric layer, a second piezoelectric layer stacked on the first piezoelectric layer, a first electrode arranged on the first piezoelectric layer, a second electrode arranged between the first and second piezoelectric layers, and a third electrode arranged on the second piezoelectric layer. A portion of the third electrode faces the second electrode, and another portion of the third electrode faces the first electrode. The first electrode does not face at least a portion of the second electrode. A portion, of the second piezoelectric layer, sandwiched between the second electrode and the third electrode is polarized in a first direction in a thickness direction thereof, and portions, of the first and the second piezoelectric layers, which are sandwiched between the first electrode and the third electrode and between which the second electrode is not arranged, are polarized in a direction opposite to the first direction.

18 Claims, 11 Drawing Sheets

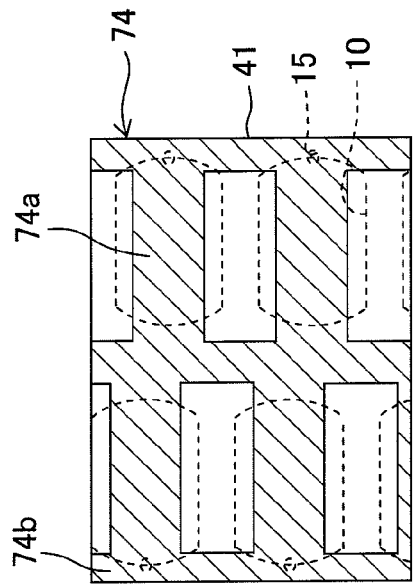
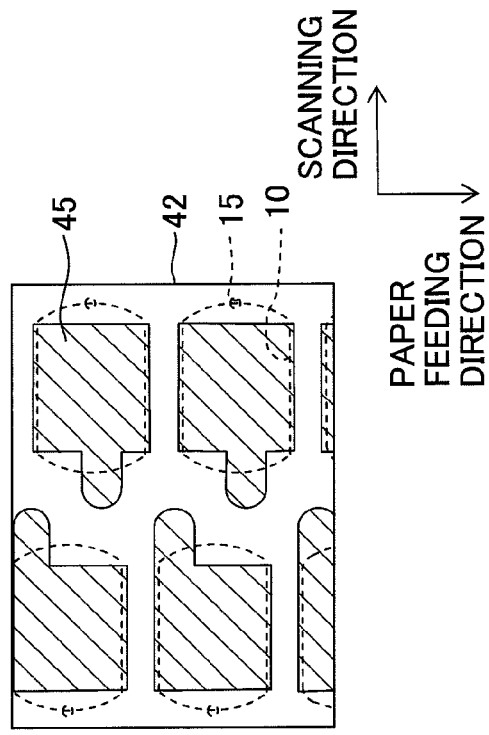
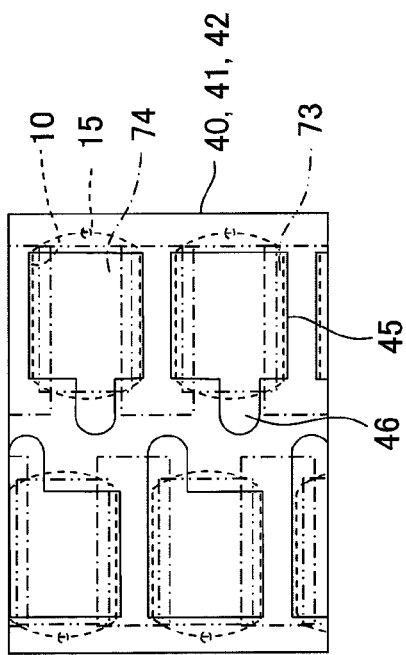
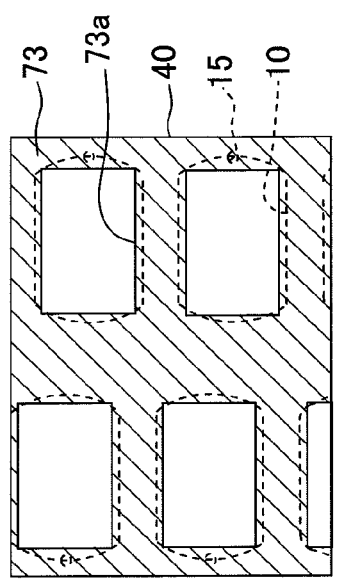

Amended element 114

PIEZOELECTRIC ACTUATOR, LIQUID TRANSPORTING APPARATUS, AND METHOD FOR MANUFACTURING PIEZOELECTRIC ACTUATOR

CROSS REFERENCE TO RELATED APPLICATION

The present application claims priority from Japanese Patent Application No. 2008-090372, filed on Mar. 31, 2008, the disclosure of which is incorporated herein by reference in its entirety.

BACKGROUND OF THE INVENTION

1. Field of the Invention

The present invention relates to a piezoelectric actuator which has a piezoelectric layer, a liquid transporting apparatus which includes the piezoelectric actuator, and a method for manufacturing piezoelectric actuator.

2. Description of the Related Art

In an ink-jet head described in US Patent Application No. 2007/0076054 (corresponds to Japanese Patent Application Laid-open No. 2007-118585), a vibration plate is arranged to cover a plurality of pressure chambers, and a piezoelectric layer is arranged on an upper surface of the vibration plate. Moreover, when an electric potential difference is generated between an individual electrode which is arranged at a portion of an upper surface of the piezoelectric layer, facing the pressure chamber, and the vibration plate as a common electrode, an electric field in a thickness direction is generated in a portion of the piezoelectric layer sandwiched between the individual electrode and the common electrode, and this portion of the piezoelectric layer contracts in a horizontal direction, and a portion of the piezoelectric layer and the vibration plate, facing the pressure chamber is deformed to form a projection toward the pressure chamber. Accordingly, a volume of the pressure chamber decreases, and a pressure of the ink in the pressure chamber rises up, thereby jetting the ink from a nozzle communicating with the pressure chamber.

Here, in such ink-jet head, for realizing a size reduction and high resolution, it is necessary to arrange the pressure chambers highly densely. However, in the ink-jet head described in US Patent Application No. 2007/0076054, when the pressure chambers are arranged highly densely and a distance between the pressure chambers becomes short, when the piezoelectric layer has contracted in the horizontal direction as described above, the portion of the piezoelectric layer facing the pressure chamber is pulled due to the contraction. Therefore, there is a possibility of occurrence of a so-called cross-talk in which jetting characteristics, of the ink jetted from the nozzle communicating with the pressure chamber, fluctuate.

Therefore, inventors of the present invention, for suppressing the cross-talk, invented an ink-jet head which will be described later. In a manufacturing process of an ink-jet head having such structure, it is necessary to carry out a polarization of the piezoelectric layer in two steps.

SUMMARY OF THE INVENTION

An object of the present invention is to provide a piezoelectric actuator in which, it is possible to polarize at a time a plurality of portions of the piezoelectric layer, and in which, a crack does not occur in the piezoelectric layer, and the piezoelectric layer is not deformed unnecessarily at the time of driving of the piezoelectric actuator, a liquid transporting apparatus which includes such piezoelectric actuator, and a method of manufacturing piezoelectric actuator.

According to a first aspect of the present invention, there is provided a piezoelectric actuator, including: a first piezoelectric layer; a second piezoelectric layer which is stacked on the first piezoelectric layer; a first electrode which is arranged on the first piezoelectric layer, on a side opposite to the second piezoelectric layer; a second electrode which is arranged between the first piezoelectric layer and the second piezoelectric layer; and a third electrode which is arranged on the second piezoelectric layer, on a side opposite to the first piezoelectric layer, and a portion of the third electrode faces the second electrode and another portion, of the third electrode, not facing the second electrode faces the first electrode, the first electrode is arranged not to face at least a portion of the second electrode, and a portion, of the second piezoelectric layer, sandwiched between the second electrode and the third electrode is polarized in a first direction in a thickness direction of the second piezoelectric layer, and a portion of the first piezoelectric layer and a portion of the second piezoelectric layer, which are sandwiched between the first electrode and the third electrode and between which the second electrode is not arranged, are polarized in a direction opposite to the first direction.

In a case of polarizing, in mutually opposite directions, the portion, of the second piezoelectric layer, sandwiched between the second electrode and the third electrode and the portion, of the first piezoelectric layer and the portion, of the second piezoelectric layer, between which the second electrode is not sandwiched and which are sandwiched between the first electrode and the third electrode, when these two portions are polarized by separate steps, two steps are necessary. Whereas, in a case of polarizing the two portions at a time, when the first electrode and the second electrode faces with each other, at the time of polarization, a substantial electric field is generated in a portion of the first piezoelectric layer sandwiched between the first electrode and the second electrode, and there is a possibility that a crack is generated in this portion of the first piezoelectric layer. Moreover, when the first electrode and the second electrode face with each other, at the time of the polarization, the portion, of the first piezoelectric layer, sandwiched between the first electrode and the second electrode is also polarized, and when an electric potential difference is generated between the first electrode and the second electrode at the time of driving of the piezoelectric actuator, this portion of the first piezoelectric layer is deformed. As a result, a compression distortion occurs in the portion, of the second piezoelectric layer, sandwiched between the second electrode and the third electrode, and driving characteristics of the piezoelectric actuator when the electric potential difference is generated between the second electrode and the third electrode are declined.

However, in the present invention, since the first electrode is arranged not to face at least a part of the second electrode, the portion, of the first piezoelectric layer, sandwiched between the first electrode and the second electrode becomes smaller than a case in which the first electrode faces the entire area of the second electrode. Therefore, at the time of polarizing the abovementioned two portions simultaneously by generating the electric potential difference between the second electrode and the third electrode, and between the first electrode and the third electrode respectively, it is possible to suppress an occurrence of a crack, in the portion of the first piezoelectric layer, sandwiched between the first electrode and the second electrode, and an occurrence of an unnecessary deformation in the first piezoelectric layer at the time of driving of the piezoelectric actuator, due to the polarization of this portion of the first piezoelectric layer.

In the piezoelectric actuator according to the present invention, a first electric potential may be applied to the first electrode, a second electric potential which is different from the first electric potential may be applied to the second electrode, and the first electric potential and the second electric potential may be applied selectively to the third electrode. By keeping the first electrode and the second electrode at the first electric potential and the second electric potential respectively, and applying the first electric potential and the second electric potential selectively to the third electrode, it is possible to drive the piezoelectric actuator easily.

In the piezoelectric actuator according to the present invention, the third electrode may face the second electrode at a central portion of the third electrode and the third electrode extends, on both sides of the central portion in a second direction on a plane of the second piezoelectric layer, up to outsides of the second electrode, and the first electrode may be arranged to face the portion, of the third electrode, extending up to the outsides of the second electrode. Even when the first electrode, the second electrode, and the third electrode are arranged in such manner, by arranging the first electrode not to face at least a portion of the second electrode, the portion, of the first piezoelectric layer, sandwiched between the first electrode and the second electrode becomes smaller than a case in which the first electrode faces the entire area of the second electrode. Accordingly, at the time of polarizing the abovementioned two portions simultaneously, there hardly occurs a crack, and it is possible to suppress the occurrence of the unnecessary deformation in the first piezoelectric layer at the time of driving of the piezoelectric actuator.

In the piezoelectric actuator according to the present invention, the third electrode may face the first electrode at a central portion of the third electrode and the third electrode extends, on both sides of the central portion in a second direction on a plane of the second piezoelectric layer, up to outsides of the first electrode, and the second electrode may be arranged to face the portion, of the third electrode, extending up to the outsides of the first electrode. In this case, at the time of polarizing the abovementioned two portions simultaneously, there hardly occurs a crack, and it is possible to suppress the occurrence of unnecessary deformation in the first piezoelectric layer at the time of driving of the piezoelectric actuator.

In the piezoelectric actuator according to the present invention, the first electrode may be arranged not to face any portion of the second electrode. In this case, since the first electrode does not face any portion of the second electrode, a crack doesn't occur in the first piezoelectric layer at the time of polarization, and the first piezoelectric layer is not deformed unnecessarily at the time of driving of the piezoelectric actuator.

The piezoelectric actuator according to the present invention may further include a third piezoelectric layer which is arranged on the first piezoelectric layer on the side opposite to the second piezoelectric layer; and a fourth electrode which is arranged on the third piezoelectric layer on a side opposite to the first piezoelectric layer, and the first electrode may have a portion facing both the second electrode and the fourth electrode; and a portion, of the third piezoelectric layer, sandwiched between the first electrode and the fourth electrode may be polarized in the first direction. If a facing area of the first electrode and the fourth electrode becomes small due to arranging the first electrode not to face at least a portion of the second electrode, an amount of deformation of the third piezoelectric layer becomes small when the piezoelectric actuator is driven by generating an electric potential difference between the first electrode and the fourth electrode. However, in the present invention, since the first electrode is arranged in the portion facing both the second electrode and the fourth electrode, the facing area of the first electrode and the fourth electrode does not become small.

In the piezoelectric actuator according to the present invention, a first electric potential may be applied to the first electrode, a second electric potential which is different from the first electric potential is applied to the second electrode, and the first electric potential and the second electric potential may be applied selectively to the third electrode, and the first electric potential and the second electric potential may be applied selectively to the fourth electrode. By keeping the first electrode and the second electrode at the first electric potential and the second electric potential respectively, and applying the first electric potential and the second electric potential selectively to the third electrode and the fourth electrode, it is possible to drive the piezoelectric actuator easily.

The piezoelectric actuator according to the present invention may further include a fourth piezoelectric layer which is arranged on the third piezoelectric layer on the side opposite to the first piezoelectric layer; and a fifth electrode which has a same shape as the first electrode, and which is arranged, on the fourth piezoelectric layer on a side opposite to the third piezoelectric layer, at a position corresponding to a position of the first electrode as viewed from a thickness direction of the fourth piezoelectric layer, and a portion, of the fourth piezoelectric layer, sandwiched between the fourth electrode and the fifth electrode may be polarized in the direction opposite to the first direction. In this case, at the time of polarizing the first to fourth piezoelectric layers simultaneously, a crack hardly occurs in a portion, of the first, the third, and the fourth piezoelectric layers, sandwiched between the second electrode and the fifth electrode, and it is possible to suppress an occurrence of an unnecessary deformation in the first piezoelectric layer, the third piezoelectric layer, and the fourth piezoelectric layer at the time of driving of the piezoelectric actuator.

According to a second aspect of the present invention, there is provided a liquid transporting apparatus including: a liquid transporting head having a cavity unit in which a plurality of pressure chambers are formed, and a piezoelectric actuator which is joined to the cavity plate to selectively transport liquid in the pressure chambers, and which includes a first piezoelectric layer, a second piezoelectric layer stacked on the first piezoelectric layer, a first electrode arranged on the first piezoelectric layer on a side opposite to the second piezoelectric layer, a second electrode arranged between the first piezoelectric layer and the second piezoelectric layer, and a third electrode arranged on the second piezoelectric layer on a side opposite to the first piezoelectric layer; and a voltage applying mechanism which applies a voltage to the piezoelectric actuator, and which applies a first electric potential to the first electrode, a second electric potential different from the first electric potential to the second electrode, and the first electric potential and the second electric potential selectively to the third electrode, and a portion, of the third electrode, faces the second electrode, and another portion, of the third electrode, not facing the second electrode faces the first electrode, the first electrode does not face at least a portion of the second electrode, and a portion, of the second piezoelectric layer, sandwiched between the second electrode and the third electrode is polarized in a first direction in a thickness direction of the second piezoelectric layer, and a portion of the first piezoelectric layer and a portion of the second piezoelectric layer, which are sandwiched between the first electrode and the third electrode and between which the second electrode is not arranged, are polarized in a direction opposite to the first direction.

According to a third aspect of the present invention, there is provided a method of manufacturing piezoelectric actuator including: forming a piezoelectric stacked body having: a first piezoelectric layer; a second piezoelectric layer stacked on the first piezoelectric layer; a first electrode arranged on the first piezoelectric layer on a side opposite to the second piezoelectric layer; a second electrode arranged between the first piezoelectric layer and the second piezoelectric layer; and a third electrode arranged on the second piezoelectric layer on a side opposite to the first piezoelectric layer; the third electrode having a portion facing the second electrode, the third electrode having another portion not facing the second electrode and facing the first electrode, and the first electrode not facing at least a portion of the second electrode; and polarizing a portion, of the second piezoelectric layer, sandwiched between the second electrode and the third electrode in a first direction in a thickness direction of the second piezoelectric layer, and a portion of the first piezoelectric layer and a portion of the second piezoelectric layer, which are sandwiched between the first electrode and the third electrode and between which the second electrode is not arranged, in a direction opposite to the first direction, by generating electric potential differences simultaneously between the first electrode and the third electrode and between the second electrode and the third electrode.

BRIEF DESCRIPTION OF THE DRAWINGS

FIG. 8A, FIG. 8B, FIG. 8C, and FIG. 8D are diagrams corresponding to FIG. 4A, FIG. 4B, FIG. 4C, and FIG. 4D, of a first modified embodiment;

DETAILED DESCRIPTION OF THE PREFERRED EMBODIMENTS

An exemplary embodiment and modified embodiments of the present invention will be described below.

Figure 1:
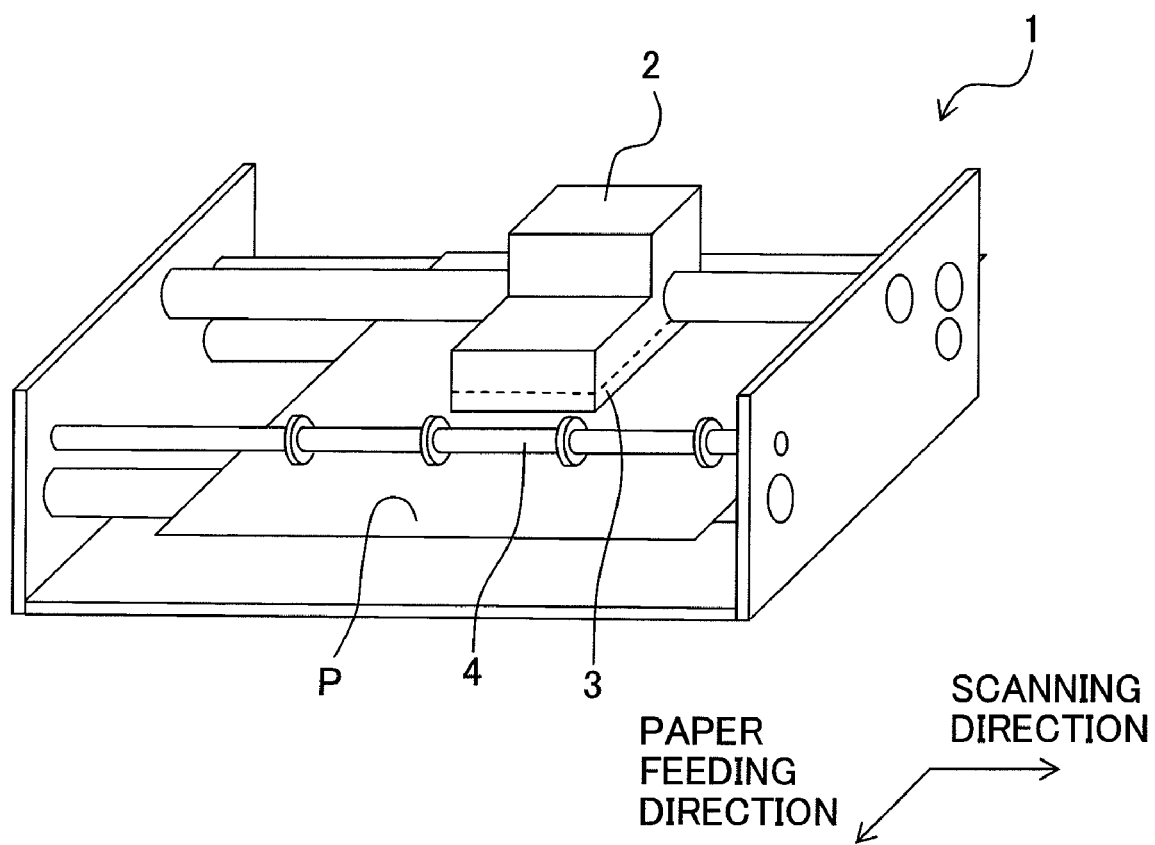
FIG. 1 is a schematic structural view of a printer according to a first embodiment of the present invention.

FIG. 1 is a schematic structural view of a printer according to a first embodiment of the present invention. As shown in FIG. 1, a printer 1 includes a carriage 2, an ink-jet head 3 (liquid droplet jetting apparatus), and a transporting roller 4.

The carriage 2 reciprocates in a scanning direction (left-right direction in FIG. 1). The ink-jet head 3 is installed on a lower surface of the carriage 2 and jets ink from nozzles 15 formed in a lower surface thereof (refer to FIG. 4 and FIG. 5). The transporting roller 4 transports a recording paper P in a paper feeding direction (frontward direction in FIG. 1). Moreover, in the printer 1, printing is carried out on the recording paper P by the ink being jetted on to the recording paper P from the nozzles 15 of the ink-jet head 3 which reciprocates in the scanning direction together with the carriage 2. The recording paper P having the printing carried out thereon is discharged in the paper feeding direction by the transporting roller 4.

Figure 2:
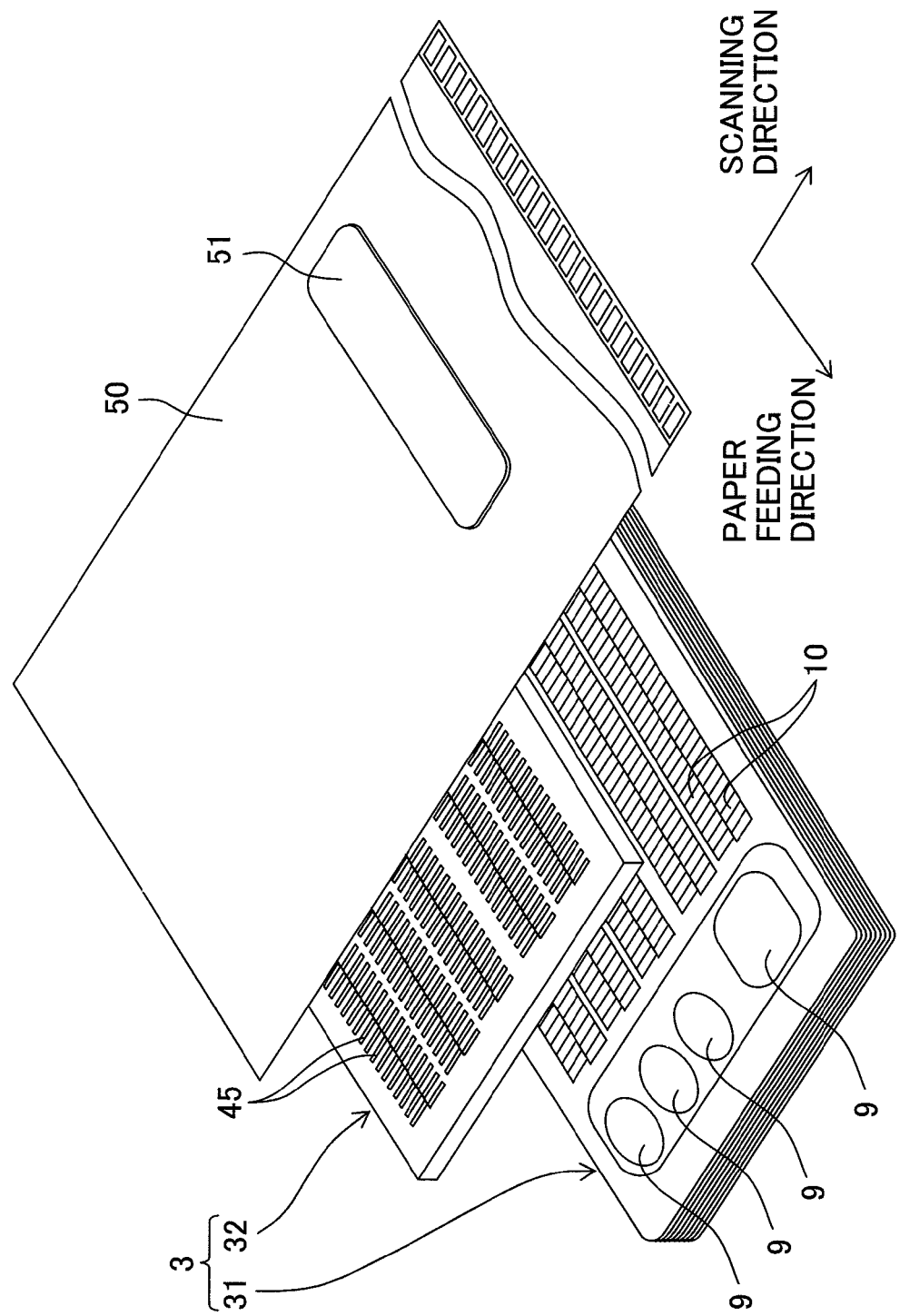
FIG. 2 is an exploded perspective view of an ink-jet head in FIG. 1.
Figure 3:
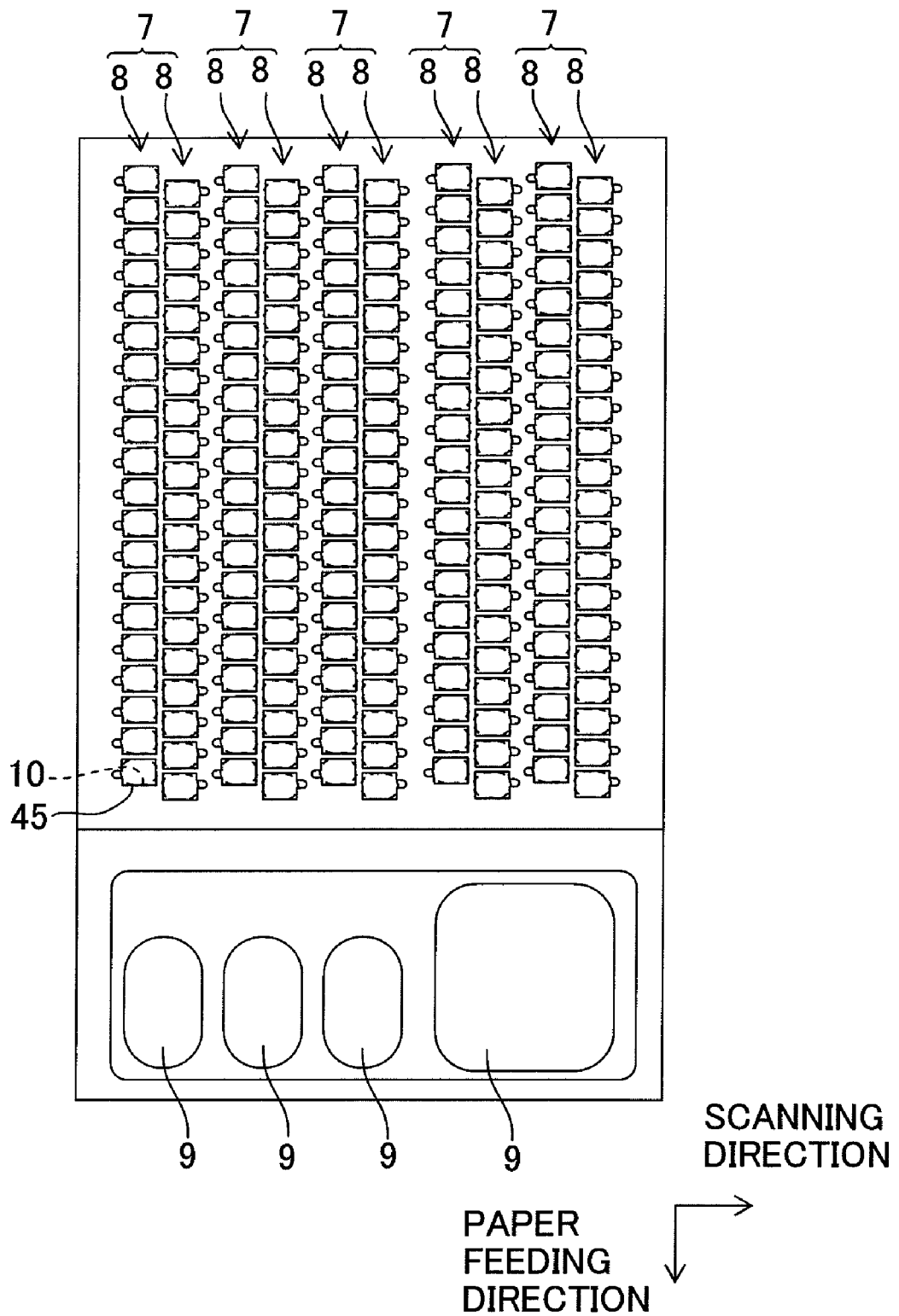
FIG. 3 is a plan view of the ink-jet head in FIG. 2.
Figure 4A:
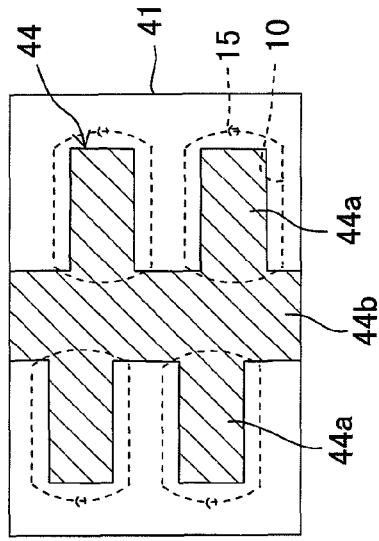
FIG. 4A is a partially enlarged view of FIG. 3, and FIG. 4B, FIG. 4C, and FIG. 4D are diagrams of a surface of each plate respectively.
Figure 4C:
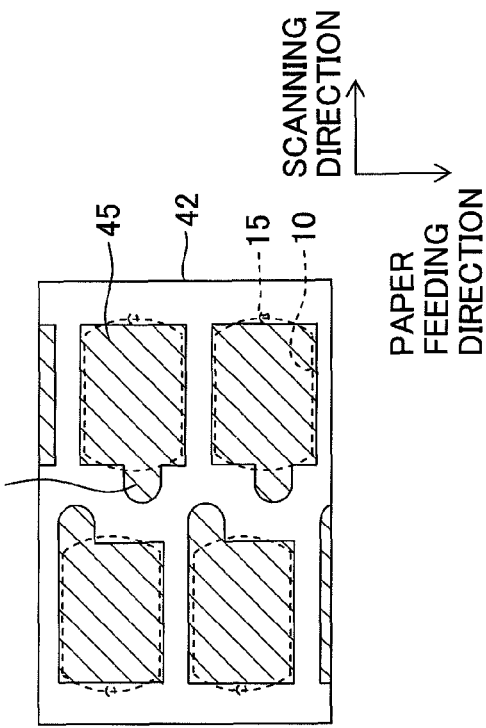
Figure 4B:
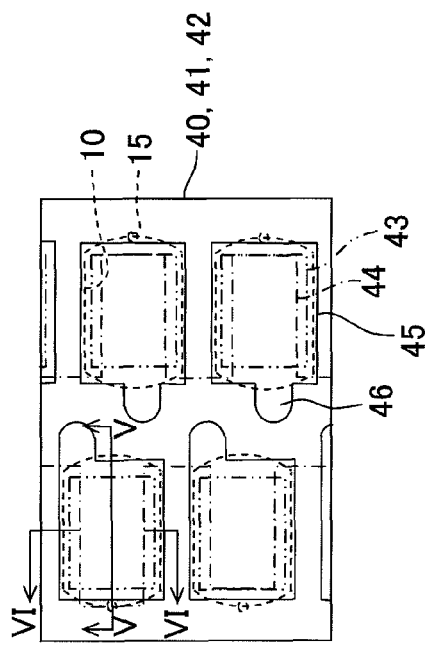
Figure 4D:
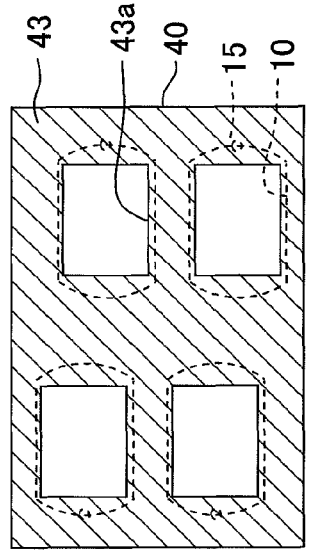
Figure 5:
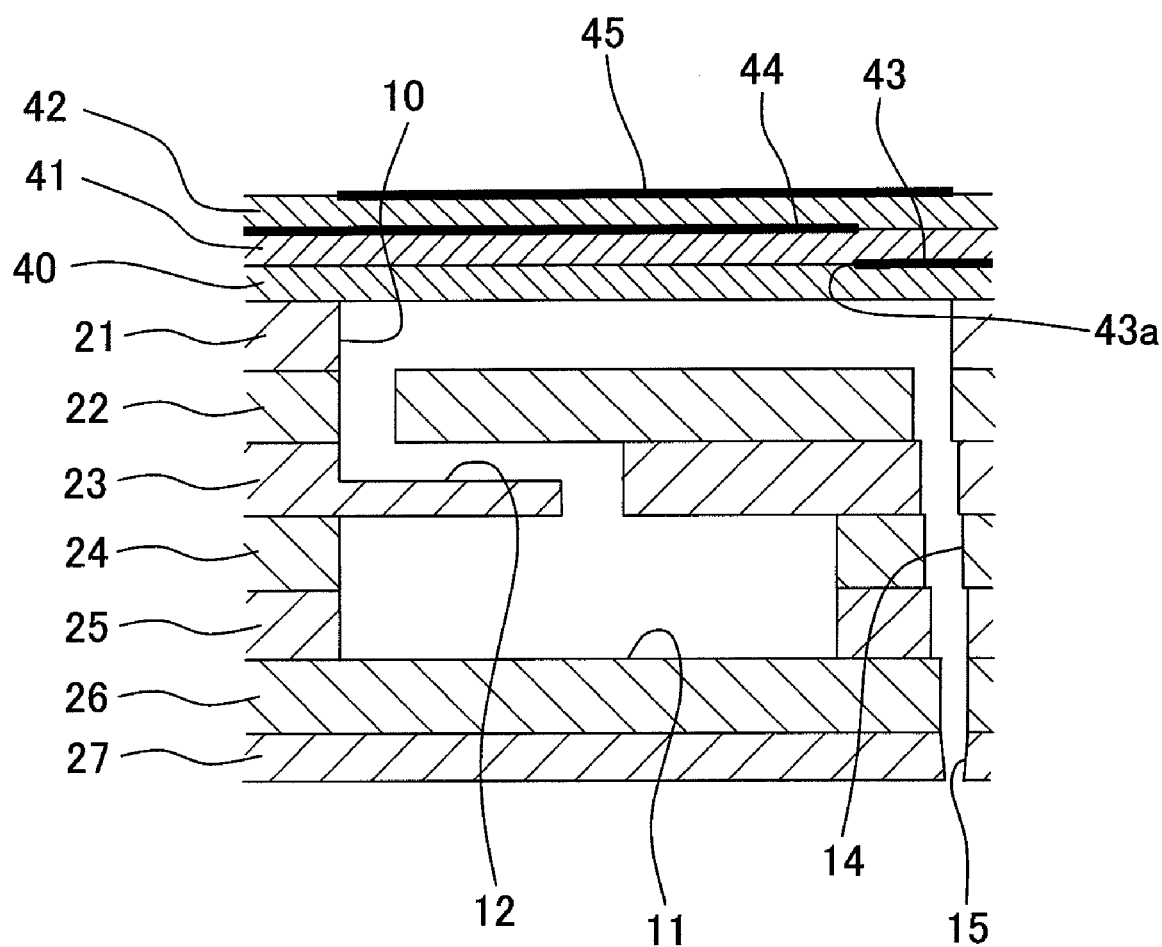
FIG. 5 is a cross-sectional view taken along a line V-V in FIG. 4A.
Figure 6:
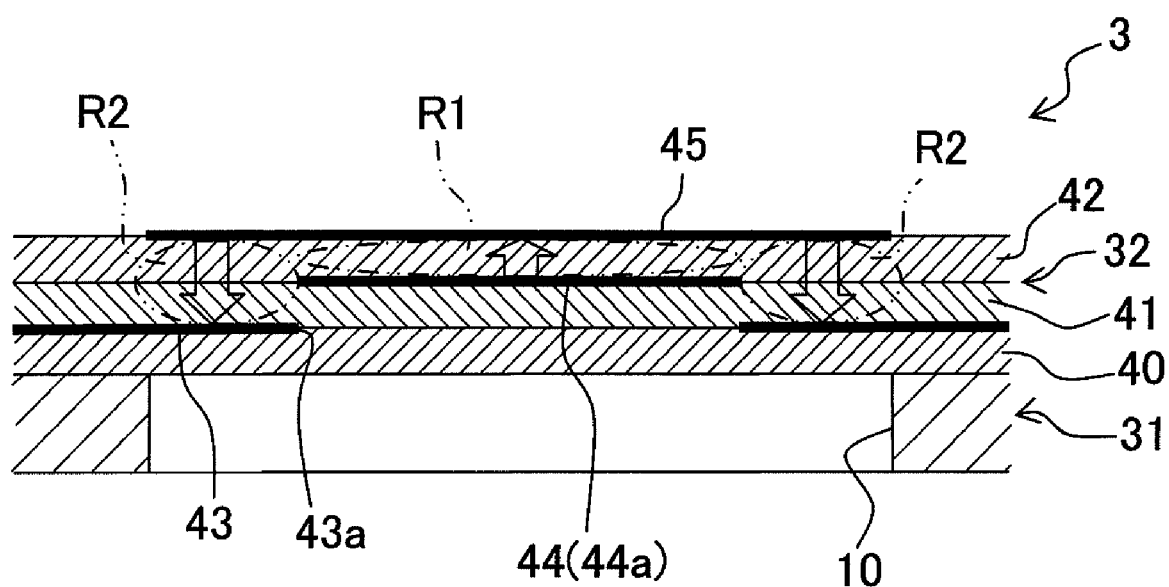
FIG. 6 is a cross-sectional view taken along a line VI-VI in FIG. 4A.

Next, the ink-jet head 3 will be described below in detail. FIG. 2 is an exploded perspective view of the ink-jet head 3 in FIG. 1. FIG. 3 is a plan view of the ink-jet head 3 in FIG. 2. FIG. 4A is a partially enlarged view of FIG. 3. FIG. 4B, FIG. 4C, and FIG. 4D (hereinafter, "FIG. 4B to FIG. 4D") are diagrams in which an upper surface of the piezoelectric layers 41 and 42, and a vibration plate 40 in FIG. 4A, which will be described later are shown respectively. FIG. 5 is a cross-sectional view taken along a line V-V in FIG. 4A. FIG. 6 is a cross-sectional view taken along a line VI-VI in FIG. 4A.

To make the diagrams easily understandable, in FIG. 3, FIG. 4A, FIG. 4B, FIG. 4C, and FIG. 4D (hereinafter, FIG. 4A to FIG. 4B), ink channels excluding pressure chambers 10 and the nozzles 15 in a channel unit 31 which will be described later are omitted, and in FIG. 3, an electrode 43 and an electrode 44 of a piezoelectric actuator 32 are omitted. In FIG. 4A, an electrode 43 and an electrode 44 which are to be indicated by dotted lines are shown by alternate two dots and a dash lines and alternate long and short dashed lines. Furthermore, in FIG. 4B to FIG. 4D, electrodes 43, 44, and 45 (hereinafter, "electrodes 43 to 45") are hatched. Moreover, in FIG. 6, a portion of the channel unit 31 lower than the pressure chamber 10 is omitted.

As shown in FIG. 2 to FIG. 6, the ink-jet head 3 includes the channel unit 31 (a cavity unit) and a piezoelectric actuator 32. The channel unit 3 is formed by a plurality of plates 21, 22, 23, 24, 25, 26, and 27 (hereinafter, "plates 21 to 27") being stacked mutually, and at an interior portion thereof, a manifold channel 11 to which the ink is supplied from an ink supply port 9, and an ink channel (liquid transporting channel) including a plurality of individual ink channels from an outlet of the manifold channel 11 up to the pressure chamber 10 via an aperture channel 12, and furthermore, from the pressure chamber 10 up to the nozzle 15 via a descanter channel 14 are formed. Moreover, as it will be described later, when a pressure is applied to the ink in the pressure chamber 10 by the piezoelectric actuator 32, the ink is jetted from the nozzle 15 which communicates with the pressure chamber 10.

The plurality of pressure chambers 10 have a substantially elliptical planar shape with the scanning direction (left-right direction in FIG. 3) as a longitudinal direction of the elliptical shape, and form a pressure chamber row 8 by being arranged in a row along the paper feeding direction (vertical direction in FIG. 3). Such pressure chamber rows 8, by being arranged in a two rows in the scanning direction, form a pressure chamber group 7. Furthermore, five such pressure chamber groups 7 are arranged in a row along the scanning direction. Here, the pressure chambers 10 which form two rows of the pressure chamber rows 8 included in one pressure chamber group 7 are arranged to be mutually misaligned in the paper feeding direction. Moreover, the plurality of nozzles 15 is also arranged similarly as the plurality of pressure chambers 10.

An ink of black color is jetted from the nozzles 15 corresponding to the pressure chambers 10 which form two pressure chamber groups 7 at a right side in FIG. 3 out of the five pressure chamber groups 7, and inks of yellow, cyan, and magenta colors are jetted from the nozzles 15 corresponding to the pressure chambers 10 which form the three pressure chamber groups 7 at a left side in FIG. 3, in order from the pressure chamber 10 arranged at a right side in FIG. 3. A structure of the other portion of the ink channel being similar to that of a conventional ink channel, a description in detail thereof is omitted here.

The piezoelectric actuator 32 includes the vibration plate 40, the piezoelectric layers 41 and 42, and the electrodes 43, 44, and 45. The vibration plate 40 is made of a piezoelectric material which is principally composed of lead zirconate titanate which is a mixed crystal of lead titanate and lead zirconate, and is arranged on an upper surface of the channel unit 31 to cover the plurality of pressure chambers 10. Moreover, a thickness of the vibration plate 40 is approximately 20 μm. However, a material of the vibration plate 40 is not limited to a piezoelectric material.

The piezoelectric layer 41 (a first piezoelectric layer) and a piezoelectric layer 42 (a second piezoelectric layer) are made of a piezoelectric material similar to a piezoelectric material of the vibration plate 40, and are arranged on an upper surface of the vibration plate 40 upon being stacked mutually. Moreover, a thickness of each of the piezoelectric layer 41 and the piezoelectric layer 42 is about 20 μm.

The electrode 43 (first electrode) is arranged between the vibration plate 40 and the piezoelectric layer 41 (on the piezoelectric layer 41 on a side opposite to the piezoelectric layer 42), spreading over the plurality of pressure chambers 10, and blank portions 43a are defined on positions facing (overlapping, when viewed from a thickness direction of the piezoelectric layers 41 and 42, with) substantially central portions of the pressure chambers 10 respectively. In other words, the electrode 43 is arranged in an area continuously spread over the plurality of pressure chambers 10, on a portion excluding portions facing the substantially central portions of the pressure chambers 10. Moreover, the electrode 43 is connected to a driver IC 51 (voltage applying mechanism) via a flexible printed circuit (FPC) 50 arranged at an upper side of the piezoelectric actuator 32, and is kept at a ground electric potential all the time by the driver IC 51.

The electrode 44 is arranged between the piezoelectric layer 41 and the piezoelectric layer 42. The electrode 44 has a plurality of facing portions 44a and a connecting portion 44b.

The facing portions 44a extend in the scanning direction (left-right direction in FIG. 4) and are arranged to face the substantially central portions of the pressure chambers 10 respectively in the paper feeding direction (vertical direction in FIG. 4). Accordingly, the facing portions 44a face the blank portions 43a respectively, and the facing portions 44a and the electrode 43 are not facing at any portions (do not overlaps when viewed from the thickness direction of the piezoelectric layers 41 and 42). In the first embodiment, the plurality of facing portions 44a of the electrodes 44 corresponds to a second electrode according to the present invention.

The connecting portion 44b is extended in the paper feeding direction between the adjacent pressure chamber groups 7, and connects the facing portions 44a mutually which are arranged on both sides in the scanning direction thereof. Moreover, the electrode 44 is connected to the driver IC 51 via the FPC 50, and is kept all the time at a predetermined driving electric potential (for example, 20V, second electric potential) which differs from the ground electric potential, by the driver IC 51.

The plurality of electrodes 45 (third electrode) have a substantially rectangular planar shape, and are arranged on an upper surface of the piezoelectric layer 42 (on a side opposite to the piezoelectric layer 41), to be facing almost entire area of the plurality of pressure chambers 10, corresponding to the plurality of pressure chambers 10. Accordingly, the plurality of electrodes 45 face the facing portions 44a respectively at substantially central portions thereof, and face the electrode 43 at portions extending up to outsides of the facing portions 44a on both sides of each of the central portions in the paper feeding direction (second direction).

Moreover, a portion of the electrode 45, at an end on an opposite side of the nozzle 15 in the scanning direction is extended up to a portion not facing the pressure chamber 10 in the scanning direction, and this portion is a connecting terminal 46 which is to be connected to the FPC 50. Moreover, the electrode 45 is connected to the FPC 50 at the connecting terminal 46, and is connected to the driver IC 51 via the FPC 50. An electric potential of the electrode 45 is switched to the ground electric potential and the driving electric potential (a first electric potential and a second electric potential are applied selectively). In this manner, the driver IC 51, by keeping the electrodes 43 and 44 at the ground electric potential and the driving electric potential respectively, and by switching the electric potential of the electrode 45 between the ground electric potential and the driving electric potential, applies a voltage to the piezoelectric actuator 32. It is desirable that a thickness of the electrodes 43, 44, and 45 is in a range of approximately 1 μm to 2 μm.

Moreover, by the piezoelectric layers 41 and 42, and the electrodes 43 to 45 being arranged as described above, a portion (an active portion R1) of the piezoelectric layer 42 facing the substantially central portion of the pressure chamber 10 is sandwiched between the electrode 45 and the facing portion 44a, and the active portion R1 is polarized upwardly (a first direction) in the thickness direction thereof.

Furthermore, a portion of the piezoelectric layer 42 and the piezoelectric layer 41 facing the pressure chamber 10 is sandwiched between the electrode 45 and the electrode 43, and out of this sandwiched portion, a portion (an active portion R2) between which the facing portion 44a is not arranged is polarized downward (a direction opposite to the first direction) in the direction of thickness thereof. A portion of the piezoelectric layer 41 which is not facing the facing portion 44a is not polarized.

Here, an operation of the piezoelectric actuator 32 will be described below. In a stand-by state before the piezoelectric actuator 32 carries out an operation of making jet the ink, as it has been described above, the electrode 43 and the electrode 44 are kept all the time at the ground electric potential and the driving electric potential respectively, and the electric potential of the electrode 45 is kept at the ground electric potential in advance. In this state, the electrode 45 is at a lower electric potential than the electrode 44, and is at the same electric potential as the electrode 43.

Accordingly, an electric potential difference is generated between the electrode 45 and the electrode 44, and an electric field in a direction same as the polarization direction is generated in the active portion R1. Accordingly, the active portion R1 contracts in a direction orthogonal to the direction of the electric field, or in other words, in a planar direction orthogonal to the direction of thickness. Accordingly, a so-called unimorph deformation occurs, and the portion of the piezoelectric layers 41 and 42, and the vibration plate 40 facing the pressure chamber 10 is deformed as a whole, to form a projection toward the pressure chamber 10. In this state, a volume of the pressure chamber 10 is smaller as compared to a case in which the piezoelectric layers 41 and 42, and the vibration plate 40 are not deformed.

At the time of driving the piezoelectric actuator 32 to make the ink jet, the electric potential of the electrode 45 is switched to the driving electric potential once, and upon elapsing of a predetermined time, is switched to the ground electric potential. When the electric potential of the electrode 45 is switched to the driving electric potential, the electrode 45 is at the same electric potential as the electrode 44, and is at a higher electric potential than the electrode 43. Accordingly, the contraction of the active portion R1 regains original state (the active portion R1 which is contracted return to original state), and at the same time, an electric potential difference is generated between the electrode 45 and the electrode 43. Due to the electric potential difference generated between the electrode 45 and the electrode 43, an electric field in a direction same as the polarization direction of the active portion R2 is generated in the active portion R2, and the active portion R2 contracts in a planar direction thereof. Accordingly, the piezoelectric layers 41 and 42, and the vibration plate 40 as a whole, are deformed to form a projection toward an opposite side of the pressure chamber 10, and the volume of the pressure chamber 10 increases.

Thereafter, when the electric potential of the electrode 45 is switched once again to the ground electric potential, the contraction of the active portion R2 returns to an original state, and the active portion R1 contracts in a planar direction thereof. Accordingly, similarly as it has been described above, the portion of the piezoelectric layers 41 and 42, and the vibration plate 40 facing the pressure chamber 10, is deformed as a whole to project toward the pressure chamber 10, and the volume of the pressure chamber 10 decreases. Accordingly, a pressure of the ink in the pressure chamber 10 rises up (a pressure is applied to the ink inside the pressure chamber 10), and the ink is jetted from the nozzle 15 which communicates with the pressure chamber 10.

In this manner, by keeping the electric potential of the electrodes 43 and 44 at the ground electric potential and the driving electric potential respectively, and switching the electric potential of the electrode 45 between the ground electric potential and the driving electric potential, it is possible to drive the piezoelectric actuator 32 easily.

Moreover, in a case of driving the piezoelectric actuator 32 as described above, when the electric potential of the electrode 45 is switched from the ground electric potential to the driving electric potential, the active portion R1 elongates to a state before contraction from a state of being contracted, and simultaneously, the active portion R2 contracts. Therefore, the elongation of the active portion R1 is partly absorbed by the contraction of the active portion R2. On the other hand, when the electric potential of the electrode 45 is returned from the driving electric potential to the ground electric potential, the active portion R1 contracts and the active portion R2 elongates up to a state before being contracted. Therefore, the contraction of the active portion R1 is partly absorbed by the elongation of the active portion R2.

Accordingly, a so-called cross-talk in which, the deformation of the portion of the piezoelectric layer 41 and the piezoelectric layer 42 facing the pressure chamber 10 is propagated to a portion facing the other pressure chamber 10, and jetting characteristics, of ink from the nozzle 15 which communicates with the other pressure chamber 10, fluctuate, is suppressed.

Figure 7A:
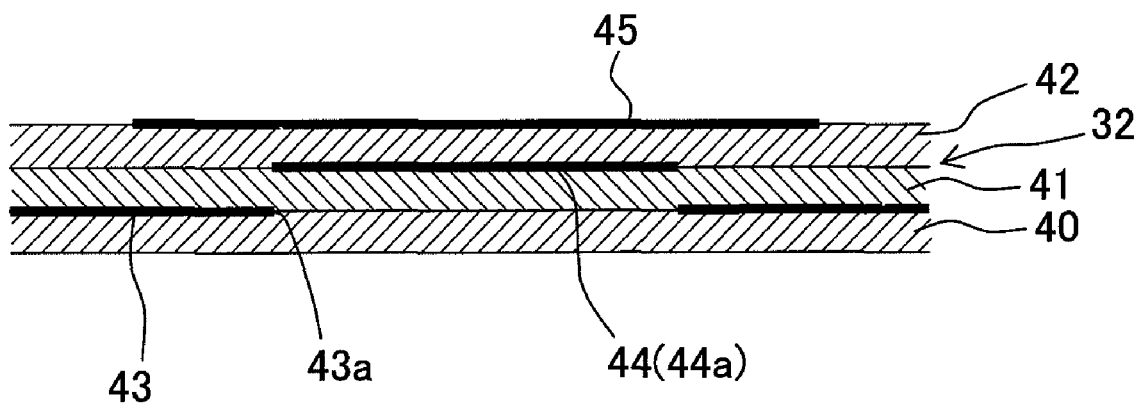
FIG. 7A and FIG. 7B are diagrams showing a manufacturing process of a piezoelectric actuator.
Figure 7B:
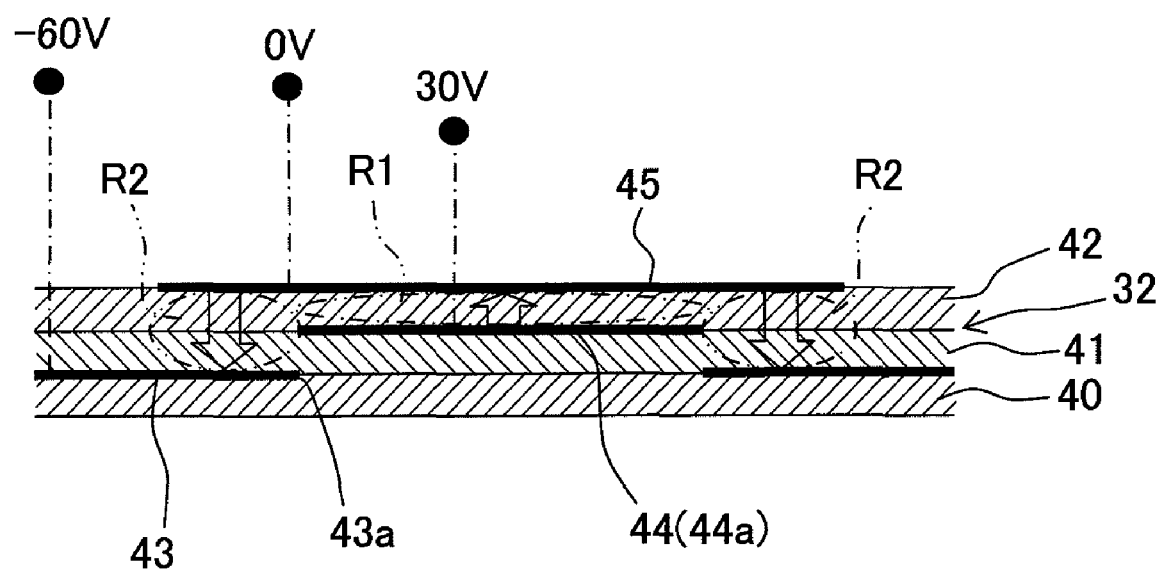

Next, a manufacturing method of the piezoelectric actuator 32 will be described below. FIG. 7A and FIG. 7B are diagrams showing a manufacturing process of the piezoelectric actuator 32.

For manufacturing the piezoelectric actuator 32, firstly, as shown in FIG. 7A, the vibration plate 40, the piezoelectric layers 41 and 42, and the electrodes 43 to 45 are stacked mutually to have the abovementioned positional relationship, and the piezoelectric actuator 32 (piezoelectric stacked body) without the active portions R1 and R2 being polarized, is made (piezoelectric stacked body forming step). Next, as shown in FIG. 7B, by applying a voltage of −60V to the electrode 43, a voltage of 30V to the electrode 44, and a voltage of 0V to the electrode 45, the electrode 45 is at a higher electric potential than the electrode 43, and the electrode 44 is at a higher electric potential than the electrode 45 (an electric potential difference is generated between the electrode 45 and the electrode 43, and at the same time, an electric potential difference is generated between the electrode 45 and the electrode 44). Accordingly, the active portion R1 is polarized upwardly in the thickness direction thereof, and at the same time, the active portion R2 is polarized downwardly in the thickness direction thereof.

At this time, since a substantial electric potential difference is generated between the electrode 44 and the electrode 43, when the blank portion 43a has not been defined on the electrode 43, and when the electrode 43 and the facing portion 44a faces each other, a substantial electric field is generated in a portion of the piezoelectric layer 41 sandwiched between the facing portion 44a and the electrode 43, and due to the electric field generated, there is a possibility that a crack occurs in this portion of the piezoelectric layer 41.

Moreover, this portion of the piezoelectric layer 41 is polarized due to the electric field generated, and when the piezoelectric actuator 32 is driven as described above, due to the electric potential difference between the facing portion 44a and the electrode 43, this portion of the piezoelectric layer 41 contracts in a planar direction all the time. Moreover, due to the contraction of the portion of the piezoelectric layer 41, a compression distortion in a planar direction occurs in the portion of the piezoelectric layer 42 sandwiched between the electrode 45 and the facing portion 44a, and an amount of deformation of this portion of the piezoelectric layer 42 when the electric potential difference is generated between the electrode 45 and the electrode 44 becomes small, and there is a possibility that driving characteristics of the piezoelectric actuator 32 are declined.

However, in the first embodiment, since the blank portions 43a are defined in the portions of the electrode 43 facing the substantially central portions of the pressure chambers 10 respectively, and the electrode 43 and the facing portions 44a do not face with each other, no substantial electric field is generated in portions of the piezoelectric layer 41 facing the facing portions 44a. Consequently, there is no occurrence of a crack in these portions of the piezoelectric layer, and the driving characteristics of the piezoelectric actuator 32 are not declined due to these portions of the piezoelectric layer 41 being polarized and being deformed unnecessarily at the time of driving of the piezoelectric actuator 32.

For manufacturing the ink-jet head 3, it is necessary to join the channel unit 31 and the piezoelectric actuator 32. However, at the piezoelectric stacked body forming step described above, the plates which form the channel unit 31 may be stacked at the same time when the vibration plate 40, the piezoelectric layers 41 and 42, and the electrodes 43 to 45 are stacked. Moreover, the piezoelectric actuator 32 may be manufactured as described above, and the channel unit 31 may be manufactured separately, and the piezoelectric actuator 32 and the channel unit 32 may be joined later.

According to the first embodiment described above, in the piezoelectric actuator 32, by applying, to the electrode 45, electric potential higher than electric potential to be applied to the electrode 43, and by applying, to the electrode 44, electric potential higher than the electric potential to be applied to the electrode 45, it is possible to polarize simultaneously the active portion R1 and the active portion R2 in mutually opposite direction. At this time, a substantial electric potential difference is generated between the electrode 43 and the electrode 44. However, since the blank portions 43a are defined in the electrode 43, and the electrode 43 and the facing portions 44a do not face, no substantial electric field is generated in the portions of the piezoelectric layer 41 facing the facing portions 44a. Consequently, a crack does not occur in these portions of the piezoelectric layer 41. Moreover, since these portions of the piezoelectric layer 41 are not polarized, when the piezoelectric actuator 32 is driven, these portions of the piezoelectric layer 41 are not deformed unnecessarily due to the electric potential difference between the electrode 43 and the electrode 44, and the jetting characteristics of the ink in the piezoelectric actuator 32 are not declined.

Moreover, by keeping the electrodes 43 and 44 at the ground electric potential and the driving electric potential respectively, and by switching the electric potential of the electrode 45 between the ground electric potential and the driving electric potential, it is possible to drive the piezoelectric actuator 32 easily.

Figure 13:
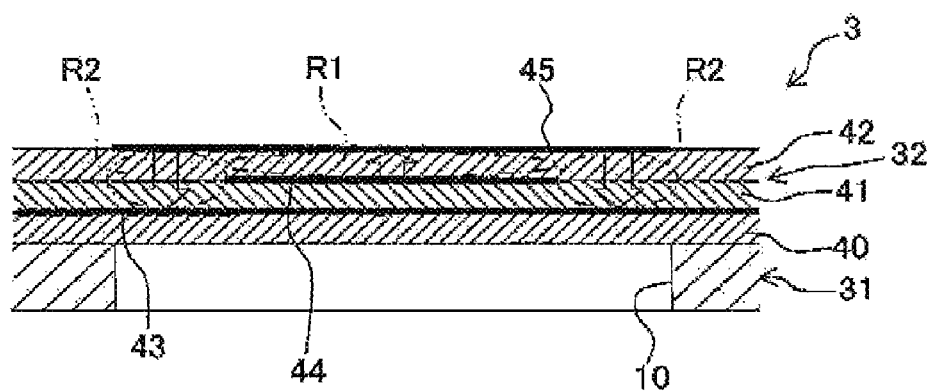
FIG. 13 is a diagram of an ink-jet head which is capable of suppressing a cross-talk.

Inventor of the present invention has invented a structure of an ink-jet head shown in FIG. 13 as a structure for suppressing the cross-talk, and have already applied for a patent for the same (Japanese Patent Application No. 2007-256922). In the ink-jet head shown in FIG. 13, two piezoelectric layers 41 and 42 are stacked on the upper surface of the vibration plate 40. Moreover, the electrode 43 which is kept at the ground electric potential is arranged between the vibration plate 40 and the piezoelectric layer 41 to face almost an entire area of the pressure chamber 10. The electrode 44 which is kept at a predetermined driving electric potential is arranged in a portion between the piezoelectric layer 41 and the piezoelectric layer 42 facing the central portion of the pressure chamber 10, and the electrode 45 of which the electric potential can be switched between the ground electric potential and the driving electric potential is arranged on the upper surface of the piezoelectric layer 42, in a portion facing almost the entire area of the pressure chamber 10. Moreover, a portion (an active portion R1) of the piezoelectric layer 42 sandwiched between the electrode 44 and the electrode 45 is polarized upward in the thickness direction, and a portion (an active portion R2) of the piezoelectric layers 41 and 42 sandwiched between the electrode 43 and the electrode 45 is polarized downward in the thickness direction thereof.

In such ink-jet head, the electric potential of the electrode 45 is kept at the ground electric potential in advance. In this state, an electric potential difference is generated between the electrode 45 and the electrode 44, and an electric field in the thickness direction thereof is generated in the portion of the piezoelectric layer 42 sandwiched between the electrode 45 and the electrode 44. Accordingly, this portion of the piezoelectric layer 42 contracts in a planar direction thereof, and the portion of the piezoelectric layers 41 and 42, and the vibration plate 40 facing the pressure chamber 10 is deformed as a whole to form a projection toward the pressure chamber 10.

At the time of making the ink jet from the nozzle, after switching once the electric potential of the electrode 45 from the ground electric potential to the driving electric potential, the electric potential is returned (switched again) to the ground electric potential upon elapsing of a predetermined time. When the electric potential of the electrode 45 becomes the driving electric potential, a contraction of the portion of the piezoelectric layer 42 sandwiched between the electrode 45 and the electrode 44 returns to (regains) an original state (the portion of the piezoelectric layer 42 sandwiched between the electrode 45 and the electrode 44 which has been contracted returns to an original state), and at the same time, an electric potential difference is generated between the electrode 45 and the electrode 43, and an electric field in the thickness direction is generated in portions of the piezoelectric layers 41 and 42 sandwiched between the electrodes 45 and 43. Accordingly, these portions of the piezoelectric layers 41 and 42 contract in a planar direction thereof, and these portions of the piezoelectric layers 41 and 42, and the vibration plate 40 facing the pressure chamber 10 are deformed as a whole to projection toward the opposite side of the pressure chamber 10.

Thereafter, when the electric potential of the electrode 45 is returned to the ground electric potential, similarly as it has been described above, the portion of the piezoelectric layers 41 and 42, and the vibration plate 40 facing the pressure chamber 10 are deformed to project toward the pressure chamber 10. Accordingly, a pressure in the pressure chamber 10 increases, and the ink is jetted from the nozzle which communicates with the pressure chamber 10.

Here, when the electric potential of the electrode 45 is changed from the ground electric potential to the driving electric potential, the portions of the piezoelectric layers 41 and 42 sandwiched between the electrode 43 and the electrode 45 contract in a planar direction thereof, and also the portion of the piezoelectric layer 42 sandwiched between the electrode 45 and the electrode 44 elongates up to an original state from a state of being contracted in the planar direction thereof. Therefore, the contraction of the portion of the piezoelectric layers 41 and 42 sandwiched between the electrode 43 and the electrode 45 is partly absorbed by the elongation of the portion of the piezoelectric layer 42 sandwiched between the electrode 44 and the electrode 45.

Furthermore, when the electric potential of the electrode 45 is changed from the driving electric potential to the ground electric potential, the portion of the piezoelectric layer 42 sandwiched between the electrode 45 and the electrode 44 contracts in the planar direction thereof, and also, the portions of the piezoelectric layers 41 and 42 sandwiched between the electrode 43 and the electrode 45 elongate up to an original state from a state of being contracted in the planar direction thereof. Therefore, the contraction of the portion of the piezoelectric layer 42 sandwiched between the electrode 44 and the electrode 45 is partly absorbed by the elongations of the portions of the piezoelectric layers 41 and 42 sandwiched between the electrode 43 and the electrode 45.

Accordingly, even when the piezoelectric layers 41 and 42 contract, a portion of the piezoelectric layers 41 and 42 facing the other pressure chamber 10 is hardly pulled, and the cross-talk as described above hardly occurs.

However, in the ink-jet head having a structure shown in FIG. 13, since the portion of the piezoelectric layer 42 sandwiched between the electrode 44 and the electrode 45, and the portions of the piezoelectric layers 41 and 42 sandwiched between the electrode 43 and the electrode 45 are polarized respectively, in a case of polarizing these portions by separate steps, two steps are necessary for polarization.

Whereas, when the electrode 45 is applied a higher electric potential than the electrode 43, and the electrode 44 is applied a higher electric potential than the electrode 45, it is possible to polarize the two portions simultaneously. However, in this case, since a substantial electric field is generated in the portion of the piezoelectric layer 41 sandwiched between the electrode 43 and the electrode 44 as compared to an electric field in the active portions R1 and R2, there is a possibility that a crack occurs in this portion of the piezoelectric layer 41. Moreover, since this portion of the piezoelectric layer 41 is polarized downwardly in the thickness direction thereof, this portion of the piezoelectric layer 41, during driving of the piezoelectric actuator, contracts in a planar direction thereof all the time. Therefore, a compression distortion in a planar direction thereof occurs in the portion of the piezoelectric layer 42 sandwiched between the electrode 44 and the electrode 45, which is arranged above this portion of the piezoelectric layer 41, and an amount of deformation of the portion, of the piezoelectric layer 42, sandwiched between the electrode 44 and the electrode 45 becomes small when the electric potential difference has generated between the electrode 44 and the electrode 45.

Next, modified embodiments in which various modifications are made in the first embodiment will be described below. However, same reference numerals are assigned to components which are similar as in the first embodiment, and the description of such components is omitted appropriately.

A structure of a piezoelectric actuator is not limited to the structure of the piezoelectric actuator in the first embodiment. In a first modified embodiment, as shown in FIG. 8A, FIG. 8B, FIG. 8C, and FIG. 8D (hereinafter, "FIG. 8A to FIG. 8D"), an electrode 73 and an electrode 74 are arranged instead of the electrode 43 and the electrode 44 respectively (refer to FIG. 4).

The electrode 73 is arranged continuously between the vibration plate 40 and the piezoelectric layer 41, to spread over the plurality of pressure chambers 10. Blank portions 73a each having a same length in the paper feeding direction (vertical direction in FIG. 8) as the blank portion 43a (refer to FIG. 4), and each extending longer in the scanning direction (left-right direction in FIG. 8) than the blank portions 43a are defined in the portions facing the substantial central portions of the pressure chambers 10 respectively.

The electrode 74 has a plurality of facing portions 74a and a plurality of connecting portions 74b. The facing portions 74a extend in the scanning direction (left-right direction in FIG. 8), and are arranged to face the substantial central portions, of the pressure chambers 10, in the paper feeding direction (vertical direction in FIG. 8). The connecting portions 74b extend in the paper feeding direction between all the pressure chamber rows 8, and connect the facing portions 74a arranged at both sides in the scanning direction.

The plurality of electrodes 45 are facing the plurality of facing portions 74a at the substantial central portions thereof respectively, and are facing the electrode 73 at the portion extending, on both sides of each facing portion 74a in the paper feeding direction, up to an outsides of each of the facing portions 74a (first modified embodiment). In the first modified embodiment, the facing portions 74a correspond to the second electrode according to the present invention.

Even in such piezoelectric actuator, plan views corresponding to FIG. 4A to FIG. 4D are similar to the diagrams of the piezoelectric actuator 32 (in FIG. 4A to FIG. 4D, reference numerals 43, 43a, and 44a are replaced by reference numerals 73, 73a, and 74a respectively). Similarly as it has been described in the first embodiment, since the blank portions 73a are defined in the electrode 73, and the electrode 73 and the facing portion 74a do not face (do not overlap when viewed from the thickness direction of the piezoelectric layers 41 and 42), it is possible to polarize the active portions R1 and R2 simultaneously. Moreover, a crack does not occur in the portions of the piezoelectric layer 41 facing the facing portions 74a, and the piezoelectric layer 41 is not deformed unnecessarily at the time of driving of the piezoelectric actuator due to polarization at these portions of the piezoelectric layer 41.

Figure 9:
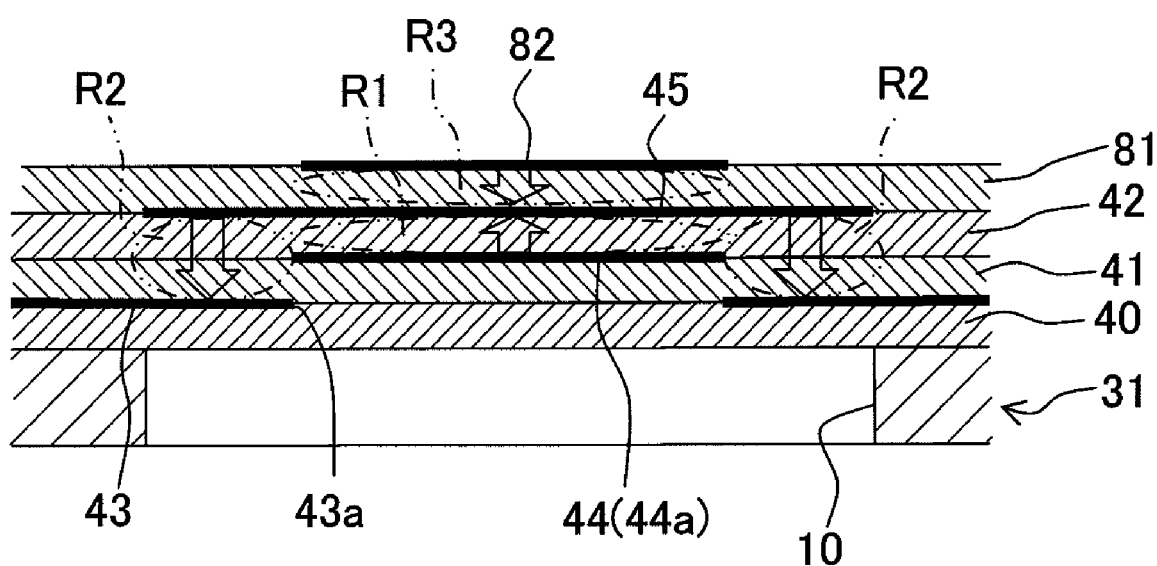
FIG. 9 is a diagram corresponding to FIG. 6, of a second modified embodiment.

In a second modified embodiment, as shown in FIG. 9, a piezoelectric layer 81 is further arranged on the upper surface of the piezoelectric layer 42, and an electrode 82 having a planar shape similar to the electrode 44 is arranged on an upper surface of the piezoelectric layer 82. Moreover, a portion (an active portion R3) of the piezoelectric layer 81 sandwiched between the electrode 45 and the electrode 82 is polarized downwardly in the thickness direction thereof, and the electrode 82 and the electrode 44 is kept at the driving electric potential all the time.

In this case, when the electrode 45 is at the ground electric potential, in addition to the active portion R1 contracting in the planar direction thereof as it has been described in the first embodiment, since an electric field in a direction same as a polarization direction thereof is generated in the active portion R3 due to an electric potential difference between the electrode 82 and the electrode 45, the active portion R3 also contracts in the planar direction. Consequently, an amount of deformation of the piezoelectric layers 41, 42, and 81, and the vibration plate 40 at this time becomes substantial. Moreover, in this case, at the time of polarization, when the electric potential of the electrodes 43, 44, and 45 is at an electric potential similar to the case of the first embodiment, and an electric potential of the electrode 82 is at the same electric potential as the electrode 44, it is possible to polarize the active portions R1, R2, and R3 at a time.

Figure 10:
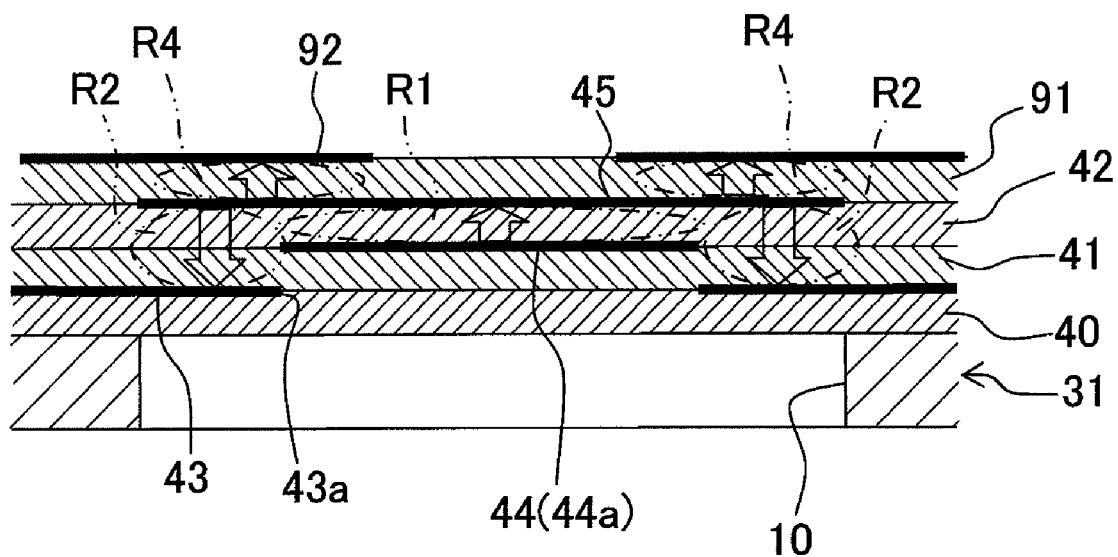
FIG. 10 is a diagram corresponding to FIG. 6, of a third modified embodiment.

In a third modified embodiment, as shown in FIG. 10, a piezoelectric layer 91 is further arranged on the upper surface of the piezoelectric layer 42, and an electrode 92 is arranged on an upper surface of the piezoelectric layer 91, to face both end portions in the paper feeding direction of the electrode 45 in a plan view. Moreover, portions (an active portion R4) of the piezoelectric layer 91 sandwiched between the electrode 45 and the electrode 92 are polarized upwardly in the thickness direction thereof, and the electrode 92 is kept at the ground electric potential all the time.

In this case, when the electrode 45 is at the driving electric potential, in addition to the active portion R2 contracting in the planar direction thereof as it has been described in the first embodiment, since an electric field in a direction same as a polarization direction thereof is generated in the active portion R4 due to an electric potential difference between the electrode 92 and the electrode 45, the active portion R4 also contracts in the planar direction. Consequently, an amount of deformation of the piezoelectric layers 41, 42, and 91, and the vibration plate 40 at this time becomes substantial.

Furthermore, in this case, when the active portion R1 contracts, since the active portions R4 in addition to the active portions R2 elongate from the state of being contracted up to a state before being contracted, the contraction of the active portion R1 is partly absorbed by the elongation of the active portions R2 and R4. Moreover, when the active portion R1 elongates from the state of being contracted up to the state before being contracted, since the active portions R4 in addition to the active portions R2 contract, the elongation of the active portion R1 is partly absorbed by the contraction of the active portions R2 and R4. Consequently, it is possible to suppress effectively the occurrence of the cross-talk.

Moreover, in this case, at the time of polarization, when the electric potentials are applied to the electrodes 43, 44, and 45 same as in the case of the first embodiment, and also the electrode 92 is applied the same electric potential as the electrode 43, it is possible to polarize the active portions R1, R2, and R4 at a time.

Figure 11:
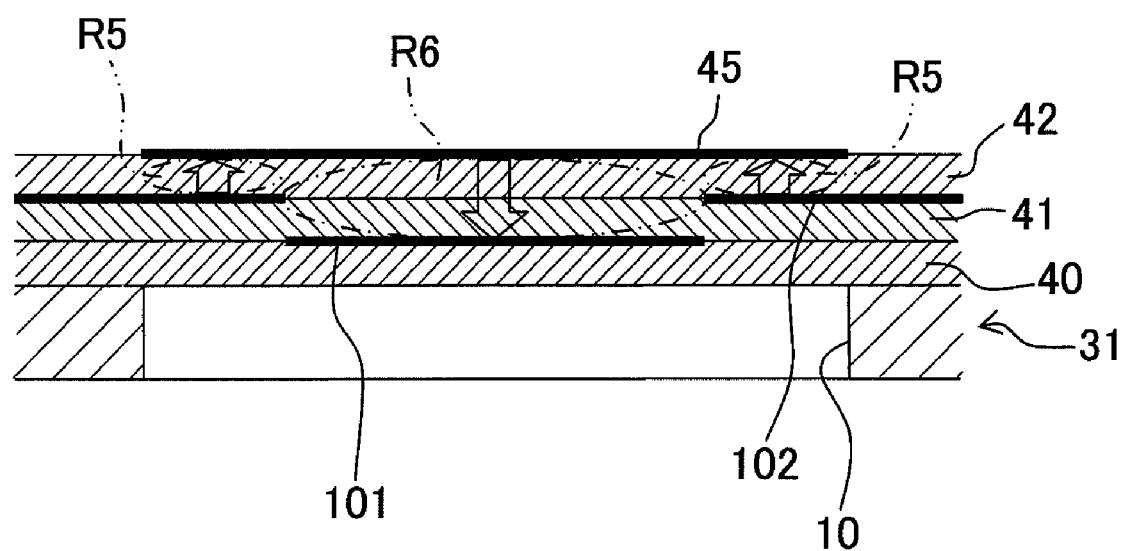
FIG. 11 is a diagram corresponding to FIG. 6, of a fourth modified embodiment.

In a fourth modified embodiment, as shown in FIG. 11, instead of the electrode 43, an electrode 101 is arranged between the first piezoelectric layer 41 and the vibration plate 40, and instead of the electrode 44, an electrode 102 is arranged between the first piezoelectric layer 41 and the second piezoelectric layer 42.

The electrode 101 (first electrode) is arranged to face the substantially central portion of the pressure chamber 10 in the paper feeding direction (left-right direction in FIG. 11). The electrode 102 (second electrode) is arranged to face portions of the electrode 45 extending, on both sides of the pressure chamber 10 in the paper feeding direction, up to outsides of the electrode 101, and does not face the electrode 101. Accordingly, the electrode 45 faces the electrode 101 at a substantially central portion thereof, and faces the electrode 102 at another portions extending up to the outsides of the electrode 101 in the paper feeding direction. Moreover, portions (an active portion R5) of the piezoelectric layer 42 sandwiched between the electrode 101 and the electrode 45 are polarized upwardly (first direction) in the thickness direction thereof, and a portion (an active portion R6) of the piezoelectric layers 41 and 42 sandwiched between the electrode 45 and the electrode 101 is polarized downwardly (direction opposite to the first direction) in the thickness direction thereof. Moreover, the electrode 101 is kept at the ground electric potential all the time, and the electrode 102 is kept at the driving electric potential all the time.

In this case, in a stand-by state before carrying out an operation of jetting the ink, the electrode 45 is kept at the driving electric potential all the time. In this state, an electric field in a direction same as the polarization direction thereof is generated in the active portion R6 due to an electric potential difference between the electrode 45 and the electrode 101. Moreover, due to the electric field generated, the active portion R6 contracts in a planar direction thereof, and a portion of the piezoelectric layers 41 and 42 and the vibration plate 40 facing the pressure chamber 10 is deformed to project to the pressure chamber 10. Accordingly, the volume of the pressure chamber 10 becomes smaller as compared to a case in which the piezoelectric layers 41 and 42, and the vibration plate 40 are not deformed.

Further, at the time of driving the piezoelectric actuator to jet the ink from the nozzles 15, the electric potential of the electrode 45 is switched once to the ground electric potential, and upon elapsing of a predetermined time, the electric potential of the electrode 45 is returned to the driving electric potential. When the electric potential of the electrode 45 is changed to the ground electric potential, an electric potential difference is generated between the electrode 45 and the electrode 102, and also the electric potential of the electrode 45 and the electrode 101 become same. Therefore, the deformation of the active portion R6 returns to original state, and the active portion R5 contracts in a planar direction thereof. Accordingly, the portion of the piezoelectric layers 41 and 42, and the vibration plate 40 facing the pressure chamber 10 is deformed to project toward the opposite side of the pressure chamber 10, and the volume of the pressure chamber 10 increases.

Moreover, when the electric potential of the electrode 45 is returned to the driving electric potential, once again the portion of the piezoelectric layers 41 and 42, and the pressure chamber 40 facing the pressure chamber 10 is deformed to project to the pressure chamber 10, and the volume of the pressure chamber 10 decreases. Therefore, the pressure of the ink inside the pressure chamber 10 is increased, and the ink is jetted from the nozzle 15 which communicates with the pressure chamber 10 (refer to FIG. 5).

Even in this case, when the electric potential of the electrode 45 is switched to the ground electric potential, the active portion R6 elongates from the state of being contracted to an original state, and the active portion R5 contracts. Therefore, the elongation of the active portion R6 is partly absorbed by the contraction of the active portion R5. Furthermore, when the electric potential of the electrode 45 is returned to the driving electric potential, the active portion R6 contracts, and the active portion R6 elongates from the state of being contracted to an original state. Therefore, the contraction of the active portion R6 is partly absorbed by the elongation of the active portion R5. Consequently, even in this case, the crosstalk is suppressed as in the first embodiment.

Moreover, in this case, at the time of polarizing the active portions R5 and R6, the electrode 45 is applied a higher electric potential than the electrode 101, and the electrode 102 is applied a higher electric potential than the electrode 45. At this time, a substantial electric potential difference is generated between the electrode 101 and the electrode 102. However, since the electrode 101 and the electrode 102 do not face each other, a crack does not occur in a portion of the piezoelectric layer facing the electrode 102 due to generation of a substantial electric field, and this portion of the piezoelectric layer 41 is not deformed unnecessarily by being polarized at the time of driving of the piezoelectric actuator.

Figure 12:
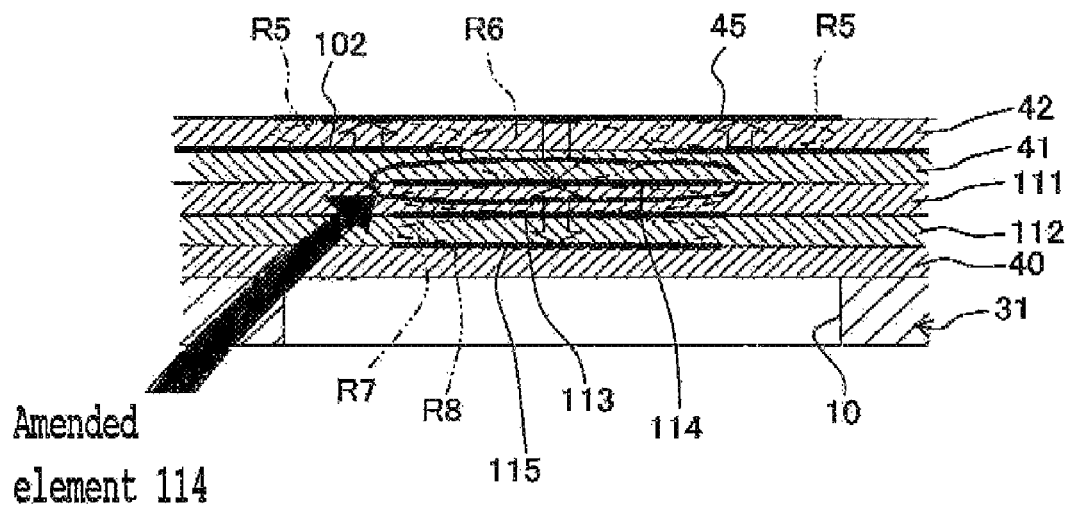
FIG. 12 is a diagram corresponding to FIG. 6, of a fifth modified embodiment.

In a fifth modified embodiment, as shown in FIG. 12, piezoelectric layers 111 and 112 are stacked between the piezoelectric layer 41 and the vibration plate 40. More elaborately, the piezoelectric layer 111 (third piezoelectric layer) is arranged on a lower surface of the piezoelectric layer 41 (opposite side of the piezoelectric layer 42), and the piezoelectric layer 112 (fourth piezoelectric layer) is arranged on a lower surface of the piezoelectric layer 111 (opposite side of the piezoelectric layer 41).

Moreover, the electrode 102, similar to the electrode in the fourth modified embodiment, is arranged between the piezoelectric layer 41 and the piezoelectric layer 42, and electrode 113 (fourth electrode) which faces a substantial central portion of the electrode 45 in a plan view and extends up to portions facing the electrode 102 on both sides in the paper feeding direction (left-right direction in FIG. 12) is arranged between the piezoelectric layer 111 and the piezoelectric layer 112. Furthermore, an electrode 114 (first electrode) and an electrode 115 (fifth electrode) having the same shape and facing an entire area of the electrode 113 are formed between the piezoelectric layer 41 and the piezoelectric layer 111, and between the piezoelectric layer 112 and the vibration plate 40 respectively. In other words, the electrodes 114 and 115 are arranged to face a portion of the electrode 102 facing the electrode 113 (are arranged in a portion facing both the electrode 102 and the electrode 113), and not facing a portion of the electrode 102 excluding this portion.

Moreover, a portion (an active portion R7) of the piezoelectric layer 111 sandwiched between the electrode 113 and the electrode 114 is polarized upwardly in a thickness direction (first direction) thereof, and a portion (an active portion R8) of the piezoelectric layer 112 sandwiched between the electrode 113 and the electrode 115 is polarized downwardly in a thickness direction thereof (direction opposite to the first direction). Furthermore, an electric potential of both the electrode 113 and the electrode 45 is switched between the ground electric potential and the driving electric potential, and the electrodes 114 and 115 are kept at the ground electric potential all the time.

In this case, when the electrode 45 is at the driving electric potential and the active portion R6 contracts in a planar direction thereof, due to an electric potential difference between the electrode 113 and the electrodes 114 and 115, an electric field in a direction same as a polarization direction is generated in the active portions R7 and R8, and due to the electric field generated, the active portions R7 and R8 contract. Accordingly, at this time, an amount of deformation of the piezoelectric layers 41, 42, 111, and 112 becomes substantial.

Moreover, in this case, at the time of polarizing the active portions R5, R6, R7, and R8 (hereinafter, "active portions R5 to R8"), for example, by applying to the electrodes 114 and 115 a the same electric potential, and applying to the electrodes 45 and 113 another electric potential higher than the electric potential to be applied to the electrodes 114 and 115, and applying to the electrode 102 still another electric potential higher than the electric potential to be applied to the electrodes 45 and 113, it is possible to polarize the active portions R5 to R8 simultaneously.

In this case, when the active portions R5 to R8 are polarized simultaneously by the abovementioned method, a portion of the piezoelectric layer 41 sandwiched between the electrode 102 and the electrode 114 is polarized unnecessarily. However, even in this case, the electrode 114 does not face the electrode 102 at a portion excluding a portion facing the electrode 113 (the electrode 114 is arranged not to face at least a part of the electrode 102). Therefore, as compared to a case in which the electrode 114 faces an entire area of the electrode 102, a portion of the piezoelectric layer 41 sandwiched between the electrode 102 and the electrode 114 is small. Accordingly, a crack hardly occurs in the piezoelectric layer 41 at the time of polarization of the active portions R5 to R8, and a decline in the driving characteristics due to an unnecessary deformation of the piezoelectric layer 41 when the piezoelectric actuator is driven is suppressed.

Moreover, the electrode 115 does not face the electrode 102 at a portion excluding a portion facing the electrodes 113 and 114. Therefore, as compared to a case in which the electrode 115 faces the electrode 102 even at a portion excluding the portion facing the electrodes 113 and 114, even when an electric potential difference is generated between the electrode 102 and the electrode 115 at the time of polarization of the active portions R5 to R8, a crack hardly occurs in the piezoelectric layers 41, 111, and 112. Furthermore, portions of the piezoelectric layers 41, 111, and 112 are not polarized unnecessarily at the time of polarization of the active portions R5 to R8, and the piezoelectric layers 41, 111, and 112 are suppressed from being deformed unnecessarily due to the electric potential difference between the electrode 102 and the electrode 115 at the time of driving of the piezoelectric actuator.

In the fifth modified embodiment, when the electrodes 114 and 115 are arranged not to be facing the electrode 102 including a portion facing the electrode 113, the piezoelectric layer 41 is not polarized unnecessarily as described above. However, in this case, a facing area of the electrode 113 and the electrodes 114 and 115 becomes small, and an amount of contraction of the active portions R7 and R8 when an electric potential difference is generated between the electrode 113 and the electrodes 114 and 115 becomes small.

Therefore, in the fifth modified embodiment, by extending the electrodes 114 and 115 up to a portion facing both the electrode 113 and the electrode 102 irrespective of a portion of the piezoelectric layer 41 sandwiched between the electrode 102 and the electrode 114 being polarized unnecessarily, the facing area of the electrode 113 and the electrodes 114 and 115 is made substantial, and the amount of deformation of the piezoelectric layers 111 and 112 at the time of driving of the piezoelectric actuator is increased.

Moreover, in the fifth modified embodiment, the piezoelectric layer 112 is stacked between the piezoelectric layer 111 and the vibration plate 40, and the electrode 115 is arranged between the vibration plate 40 and the piezoelectric layer 112. However, the structure may be without the piezoelectric layer 112 and the electrode 115.

In the abovementioned description, the piezoelectric actuator is an actuator which applies a pressure to the ink inside the pressure chamber 10 by letting a portion of the piezoelectric layer and the vibration plate facing the pressure chamber 10 be subjected to the so-called unimorph deformation by contracting the piezoelectric layer in a planar direction thereof. However, the piezoelectric actuator may be an actuator in which the vibration plate is not provided, and the pressure is applied to the ink in the pressure chamber 10 by changing the volume of the pressure chamber 10 directly by the deformation of the piezoelectric layer in the thickness direction.

Moreover, in the abovementioned description, an example in which the present invention is applied to an ink-jet head which jets an ink from the nozzle is described. However, without restricting to this, the present invention is also applicable to a liquid droplet jetting apparatus which jets droplets of a liquid other than ink. Moreover, the present invention is also applicable to a liquid droplet jetting apparatus in which a piezoelectric actuator is used for transporting a liquid. Furthermore, the present invention is also applicable to a piezoelectric actuator for driving a predetermined drive portion in an apparatus other than a liquid droplet jetting apparatus and a liquid transporting apparatus.

What is claimed is:

1. A piezoelectric actuator comprising:
   a first piezoelectric layer;
   a second piezoelectric layer which is stacked on the first piezoelectric layer;
   a first electrode which is arranged on the first piezoelectric layer, on a side opposite to the second piezoelectric layer;
   a second electrode which is arranged between the first piezoelectric layer and the second piezoelectric layer; and
   a third electrode which is arranged on the second piezoelectric layer, on a side opposite to the first piezoelectric layer,
   wherein a portion of the third electrode faces the second electrode and another portion, of the third electrode, not facing the second electrode faces the first electrode,
   the first electrode is arranged not to face at least a portion of the second electrode,
   a portion of the second piezoelectric layer, sandwiched between the second electrode and the third electrode is polarized in a first direction in a thickness direction of the second piezoelectric layer, and a portion of the first piezoelectric layer and a portion of the second piezoelectric layer, which are sandwiched between the first electrode and the third electrode and between which the second electrode is not arranged, are polarized in a direction opposite to the first direction, and
   an area of the first piezoelectric layer and the second piezoelectric layer, sandwiched between the first electrode and the third electrode and between which the second electrode is not arranged, is larger than an area of the first piezoelectric layer, sandwiched between the first electrode and the second electrode.

2. The piezoelectric actuator according to claim 1, wherein a first electric potential is applied to the first electrode, a second electric potential which is different from the first electric potential is applied to the second electrode, and the first electric potential and the second electric potential are applied selectively to the third electrode.

3. The piezoelectric actuator according to claim 1, wherein the third electrode faces the second electrode at a central portion of the third electrode and the third electrode extends, on both sides of the central portion in a second direction on a plane of the second piezoelectric layer, up to outsides of the second electrode, and the first electrode is arranged to face the portion of the third electrode, extending up to the outsides of the second electrode.

4. The piezoelectric actuator according to claim 1, wherein the third electrode faces the first electrode at a central portion of the third electrode and the third electrode extends, on both sides of the central portion in a second direction on a plane of the second piezoelectric layer, up to outsides of the first electrode, and the second electrode is arranged to face the portion of the third electrode, extending up to the outsides of the first electrode.

5. The piezoelectric actuator according to claim 1, wherein the first electrode is arranged not to face any portion of the second electrode.

6. The piezoelectric actuator according to claim 1, wherein the first electrode has a pattern in which a blank portion is defined at a position facing the second electrode.

7. The piezoelectric actuator according to claim 1, further comprising:
a third piezoelectric layer which is arranged on the first piezoelectric layer on the side opposite to the second piezoelectric layer; and
a fourth electrode which is arranged on the third piezoelectric layer on a side opposite to the first piezoelectric layer,
wherein the first electrode has a portion facing both the second electrode and the fourth electrode; and a portion of the third piezoelectric layer, sandwiched between the first electrode and the fourth electrode is polarized in the first direction.

8. The piezoelectric actuator according to claim 7, wherein a first electric potential is applied to the first electrode, a second electric potential which is different from the first electric potential is applied to the second electrode, and the first electric potential and the second electric potential are applied selectively to the third electrode, and the first electric potential and the second electric potential are applied selectively to the fourth electrode.

9. The piezoelectric actuator according to claim 7, further comprising:
a fourth piezoelectric layer which is arranged on the third piezoelectric layer on the side opposite to the first piezoelectric layer; and
a fifth electrode which has a same shape as the first electrode, and which is arranged, on the fourth piezoelectric layer on a side opposite to the third piezoelectric layer, at a position corresponding to a position of the first electrode as viewed from a thickness direction of the fourth piezoelectric layer,
wherein a portion of the fourth piezoelectric layer, sandwiched between the fourth electrode and the fifth electrode is polarized in the direction opposite to the first direction.

10. The piezoelectric actuator according to claim 1, wherein a portion of the first piezoelectric layer facing the second electrode and not facing the first electrode is not polarized.

11. A liquid transporting apparatus comprising:
a liquid transporting head having a cavity unit in which a plurality of pressure chambers are formed, and a piezoelectric actuator which is joined to the cavity plate to selectively transport liquid in the pressure chambers, and which includes a first piezoelectric layer, a second piezoelectric layer stacked on the first piezoelectric layer, a first electrode arranged on the first piezoelectric layer on a side opposite to the second piezoelectric layer, a second electrode arranged between the first piezoelectric layer and the second piezoelectric layer, and a third electrode arranged on the second piezoelectric layer on a side opposite to the first piezoelectric layer; and
a voltage applying mechanism which applies a voltage to the piezoelectric actuator, and which applies a first electric potential to the first electrode, a second electric potential different from the first electric potential to the second electrode, and the first electric potential and the second electric potential selectively to the third electrode,
wherein a portion of the third electrode, faces the second electrode, and another portion, of the third electrode, not facing the second electrode faces the first electrode,
the first electrode does not face at least a portion of the second electrode, and
a portion of the second piezoelectric layer, sandwiched between the second electrode and the third electrode is polarized in a first direction in a thickness direction of the second piezoelectric layer, and a portion of the first piezoelectric layer and a portion of the second piezoelectric layer, which are sandwiched between the first electrode and the third electrode and between which the second electrode is not arranged, are polarized in a direction opposite to the first direction.

12. The liquid transporting apparatus according to claim 11, wherein the first electrode is arranged not to face any portion of the second electrode.

13. The liquid transporting apparatus according to claim 11, wherein the first electrode has a pattern in which a blank portion is defined at a position facing the second electrode.

14. The liquid transporting apparatus according to claim 11, wherein: each of the pressure chambers extends in a predetermined direction;
the third electrode is formed as a plurality of third electrodes facing the pressure chambers respectively;
the second electrode has a plurality of facing portions each of which overlaps with a central portion, of one of the pressure chambers, in a width direction of one of the pressure chambers, and each of which extends in the predetermined direction, and a connecting portion which connects one ends, of the facing portions, in the predetermined direction, and which extends in a direction orthogonal to the predetermined direction; and
the first electrode has a pattern in which blank portions are defined at positions facing the pressure chambers.

15. A method for manufacturing piezoelectric actuator comprising:
forming a piezoelectric stacked body having: a first piezoelectric layer; a second piezoelectric layer stacked on the first piezoelectric layer; a first electrode arranged on the first piezoelectric layer on a side opposite to the second piezoelectric layer; a second electrode arranged between the first piezoelectric layer and the second piezoelectric layer; and a third electrode arranged on the second piezoelectric layer on a side opposite to the first piezoelectric layer; the third electrode having a portion facing the second electrode, the third electrode having another portion not facing the second electrode and facing the first electrode, and the first electrode not facing at least a portion of the second electrode; and polarizing a portion of the second piezoelectric layer, sandwiched between the second electrode and the third electrode in a first direction in a thickness direction of the second piezoelectric layer, and a portion of the first piezoelectric layer and a portion of the second piezoelectric layer, which are sandwiched between the first electrode and the third electrode and between which the second electrode is not arranged, in a direction opposite to the first direction, by generating electric potential differences simultaneously between the first electrode and the third electrode and between the second electrode and the third electrode, wherein an area of the first piezoelectric layer and the second piezoelectric layer, sandwiched between the first electrode and the third electrode and between which the second electrode is not arranged, is larger than an area of the first piezoelectric layer, sandwiched between the first electrode and the second electrode.

16. The method for manufacturing piezoelectric actuator according to claim 15, wherein the first electrode is arranged not to face any portion of the second electrode.

17. The method for manufacturing piezoelectric actuator according to claim 15, wherein the first electrode has a pattern in which a blank portion is defined at a position facing the second electrode.

18. The method for manufacturing piezoelectric actuator according to claim 15, wherein a portion of the first piezoelectric layer facing the second electrode and not facing the first electrode is not polarized.

* * * * *